United States Patent [19]

Kawakami et al.

[11] Patent Number: 5,377,425
[45] Date of Patent: Jan. 3, 1995

[54] VACUUM DRYING APPARATUS

[75] Inventors: Osamu Kawakami, Itami; Kaichi Tsuruta, Mouka, both of Japan

[73] Assignees: Nikku Industry Co., Ltd., Itami; Senju Metal Industry Co., Ltd., Tokyo, both of Japan

[21] Appl. No.: 934,655

[22] PCT Filed: May 22, 1992

[86] PCT No.: PCT/JP92/00657
§ 371 Date: Jan. 7, 1993
§ 102(e) Date: Jan. 7, 1993

[87] PCT Pub. No.: WO92/20984
PCT Pub. Date: Nov. 26, 1992

[30] Foreign Application Priority Data

May 24, 1991 [JP] Japan .................. 3-046511[U]

[51] Int. Cl.⁶ .......................................... F26B 13/30
[52] U.S. Cl. .................................. 34/92; 34/408; 34/412
[58] Field of Search .............. 34/5, 15, 16, 92, 287, 34/289, 408, 412, 406, 403, 290, 418, 68

[56] References Cited

U.S. PATENT DOCUMENTS

| | | | |
|---|---|---|---|
| 3,233,333 | 2/1966 | Oppenheimer | 34/5 |
| 4,514,912 | 5/1985 | Janusch et al. | 34/15 |
| 5,115,576 | 5/1992 | Roberson, Jr. et al. | 34/15 |
| 5,117,564 | 6/1992 | Taguchi et al. | 34/5 |
| 5,203,927 | 4/1993 | Yoshida et al. | 34/15 |

FOREIGN PATENT DOCUMENTS

| | | |
|---|---|---|
| 40-3668 | 2/1965 | Japan . |
| 48-33001 | 5/1973 | Japan . |
| 50-44545 | 4/1975 | Japan . |
| 51-12904 | 1/1976 | Japan . |
| 51-22807 | 2/1976 | Japan . |
| 53-2923 | 2/1978 | Japan . |
| 61-165579 | 7/1986 | Japan . |
| 62-54443 | 3/1987 | Japan . |
| 63-302521 | 12/1988 | Japan . |
| 1-193584 | 8/1989 | Japan . |
| 1-235604 | 8/1989 | Japan . |
| 1-226157 | 9/1989 | Japan . |
| 2-50072 | 2/1990 | Japan . |

Primary Examiner—Denise Gromada
Attorney, Agent, or Firm—Nikaido, Marmelstein, Murray & Oram

[57] ABSTRACT

A vacuum drying apparatus characterized by a means for pre-heating a product by hot air, provided to a vacuum container having a heater housed therein.

2 Claims, 2 Drawing Sheets

VACUUM DRYING APPARATUS

FIELD OF ART

The present invention relates to a vacuum drying apparatus for use in or for drying industrial products such as printed boards and electronic parts subjected to washing with water.

BACKGROUND ART

While products such as printed boards and electronic parts are usually subjected to processing steps such as soldering, machining and pressing in their way to be made finished products, it almost always occurs during such processing steps that the products become contaminated with flux residual and oil. Such contaminating flux residual and oil must be completely removed away before the products are made finished ones. To this end, it is usually operated to wash the processed products (hereinafter simply called products) with a solvent such as fluorocarbon and 1,1,1-trichloroethane.

However, according to the "Montreal Agreement under Vienna Treaty" of May 1989, the use of fluorocarbon is to be completely abolished by year 2000 A.D., so that the use of fluorocarbon has rapidly come to be suppressed and will become completely abolished eventually. Thus, lately it has grown to be of practice to carry out the washing with use of water which is not causative of environmental pollution.

However, if water remains to be deposited on products after they are washed with water, this gives rise to an insulation failure or corrosion in the cases of printed boards and electronic parts and elements, so that products washed with water should necessarily be dried completely.

Conventionally known drying apparatus include heating driers in which the products are heated to 100° C. or above to evaporate water away, hot air driers in which the products are subjected to flow of hot air and dried, relying on vigorous flow and heat of hot air, and vacuum driers in which the products are dried in vacuum while they are heated at a low temperature.

Using a heating drier, the products are heated to 100° C. or above, and it is likely in the cases of products the heat resistance of which is relatively low that they undergo a thermal damage and/or a lowering of their function or performance. Also, in the case of hot air driers, hot air is blown at a high flow velocity against the products, so that products of a light weight and/or of a fine structure are likely to be blown off to undergo breakage or impairing. In contrast to the above driers, vacuum driers use a heating temperature which is relatively low, and in addition, they do not use a vigorous flow of hot air, so that they are free of the shortcomings of the heating driers and the hot air driers.

However, conventional vacuum driers are only of such a very simple structure as comprising a vacuum container and a heater incorporated therein, so that a large amount of time is required for completely drying a wet product, and where it is required to completely dry a large quantity of products which are continuously supplied, they fail to be satisfactory from the viewpoint of the production efficiency.

DISCLOSURE OF THE INVENTION

The present invention has been made in order to overcome the above indicated shortcomings of the conventional drying apparatus, and its objects center upon providing vacuum drying apparatus capable of efficiently drying a large quantity of continuously supplied products without lowering the conventionally attained rates of production.

The vacuum drying apparatus capable of attaining the above object according to the present invention is characterized in that pre-heating means for heating products by hot air is incorporated in a vacuum container having a heater housed therein.

According to the arrangement in which product pre-heating means utilizing hot air is incorporated in a vacuum container having a heater housed therein as above, it is possible to efficiently dry a large quantity of products without lowering the conventionally attained production rates.

For a batch-type drying operation, preferably a suction opening and a blow-out opening are provided through walls of the vacuum container having a heater housed therein, the suction opening and the blow-out opening are communicated with each other by means of a pipe provided outside the vacuum container and, in addition, a gas flowing device and a gas heating device are provided to the pipe.

For a continuous type drying operation, preferably the vacuum container having a heater housed therein is installed on one of serially arranged conveyers and, in addition, a hot air blow-out device is installed on a conveyer located upstream of the conveyer carrying the vacuum container thereon.

Further, by providing a plurality of vacuum containers in a parallel arrangement and then by so arranging the vacuum containers as can be switched from one to another in operation, it is possible to prolong the time required for the vacuum drying operation regardless of the rate at which the products are supplied.

BEST MODE FOR CARRYING OUT THE INVENTION

Now, the present invention will be described in connection with specific embodiments thereof.

Figure 1:
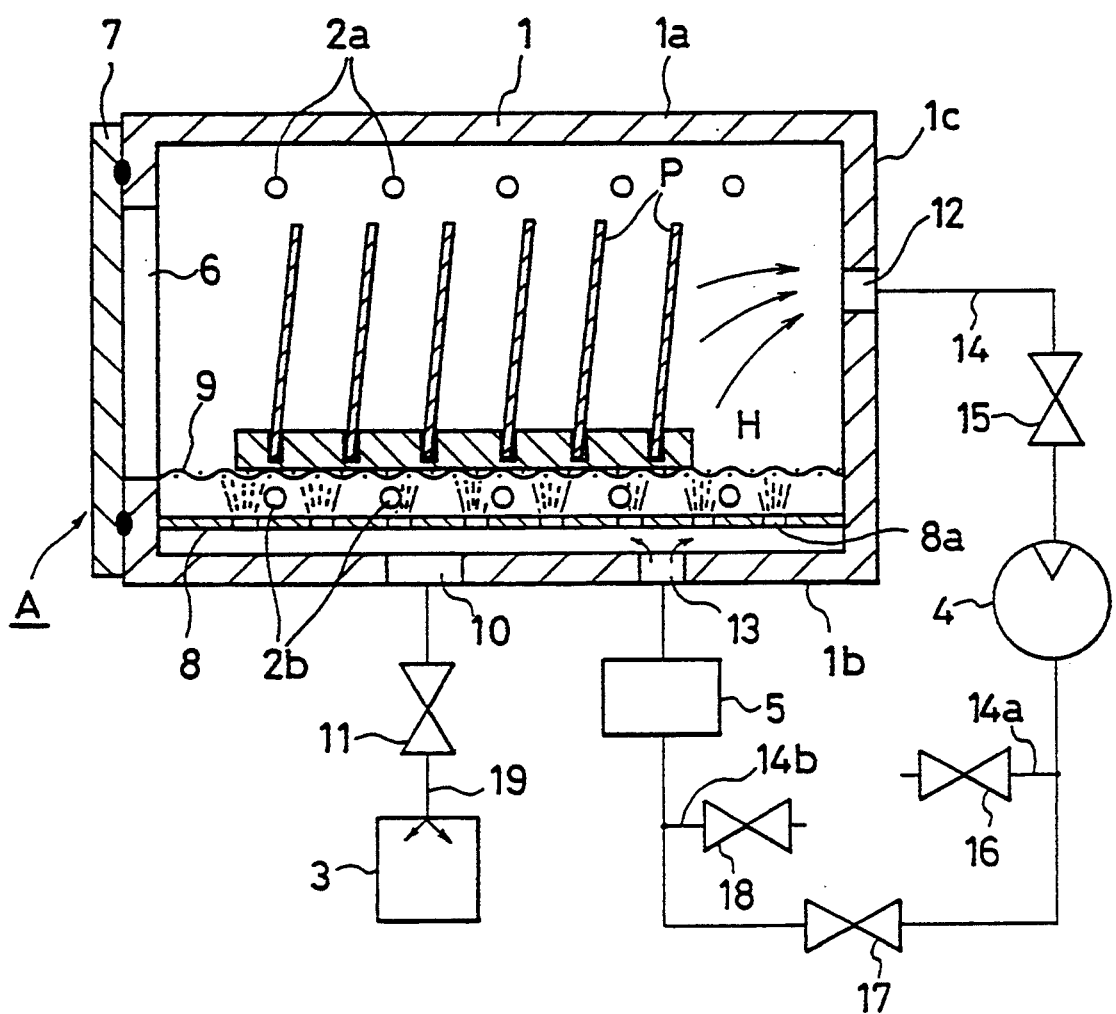
FIG. 1 is a schematic view of vacuum drying apparatus for the batch-type operation, according to the present invention.

In FIG. 1, the reference character A denotes a batch-type vacuum drying apparatus, which mainly comprises a vacuum container 1, heaters 2a, 2b, a vacuum pump 3, a blower 4 and a gas heating device 5.

The vacuum container 1 is of the type of a box, and an inlet/outlet opening 6 is formed through a side wall of this box-type container 1, a door 7 capable of sealably closing the opening 6 being secured to the side wall. Inside the vacuum container 1, further, a number of heaters 2a are arranged on the side of a ceiling wall 1a of the container and a number of heaters 2b on the side of a bottom wall 1b of the container.

Below the heaters 2b arranged on the side of the bottom wall 1b of the vacuum container 1, there is disposed a straightening plate 8 provided with a number of through-holes 8a, while upper to the heaters 2b, a net 9 is provided.

The bottom wall 1b of the vacuum container 1 has a hole 10 formed therethrough, and to a pipe 19 connected to the hole 10, a valve 11 and the vacuum pump 3 are provided in that order. Further, the vacuum container 1 has a side wall 1c, and while a suction opening 12 is formed through the side wall 1c, a blow-out opening 13 is formed through the bottom wall 1b. The suction opening 12 and the blow-out opening 13 communicate with each other through a pipe 14 disposed exterior to the vacuum container 1.

The pipe 14 is provided with a valve 15, the blower 4, a regulating valve 17 and the gas heating device 5 successively in that sequence in the direction of from the suction opening 12 to the blow-out opening 13. Further, between the blower 4 and the regulating valve 17, the pipe 14 has a branched exhaust pipe 14a, which is provided with a valve 16, and between the regulating valve 17 and the gas heating device 5, the pipe 14 also has a branched suction pipe 14b, which is provided with a valve 18.

For the heaters 2a and 2b, suitably useful is an infrared heater which can cause products to undergo a desirble heat absorption. Also, advisably the heaters 2a and 2b should be located inside the vacuum container 1 for attaining a high heating efficiency, but it is otherwise possible to embed them in the container wall or arrange them outside the container 1 depending on the capacity of the vacuum container 1 and/or the size of products.

Now, a description will be entered into the operation of the vacuum drying apparatus having the above structural features according to the present invention.

A number of printed boards P washed with water may be supported in a standing position on a holder H, and then the holder H may be placed on the screen 9 inside the vacuum container 1, followed by closing the door 7.

Then, the heaters 2a, 2b and the gas heating device 5 are brought to a heating condition, and the blower 4 may be then driven, whereupon the inside of the vacuum container 1 becomes heated by the number of heaters 2a and 2b and, at the same time as this, the air inside the vacuum container 1 is sucked out by the blower 4, becomes heated through the gas heating device 5 and uniformly blown out through the number of through-holes 8a in the straightening plate 8. Thus, the printed boards 9 are heated by the heaters 2a, 2b and the hot air coming out via the through-holes 8a in the straightening plate 8 and are at the same time dried as a result of their contact with the hot air.

The flow of the hot air is not required to be so intensely made as to possibly blow the printed boards P off the holder H and its intensity may sufficiently be such that the hot air contacts the surfaces of the printed boards P to promote the drying. The heating temperature for the printed boards P may be sufficient if it is on the order of 40° to 60°C. In the above stage of operation, the interior of the vacuum container 1 is not in a vacuum condition, so that the water present on the printed boards P is taken into circulating air through the valve 15, blower 4, regulating valve 17 and gas heating device 5. In such course of operation, while the regulating valve 17 is suitably squeezed, the valves 16 and 18 may be gradually increasingly opened, whereby while air of a relatively high humidity can be discharged into air through the exhaust pipe 14a, environmental air of a lower humidity can be sucked in through the suction pipe 14b.

The sucked-in air of a relatively low humidity is heated through the gas heating device 5 to become air of a reduced relative humidity, and as such, contacts the printed boards P to remove away most of the water attached to the printed boards P and, at the same time, heats the printed boards P to a desired temperature. Thereafter, the valves 15, 16 and 18 may be closed and the vacuum pump 3 is driven to bring the inside of the vacuum container 1 to a vacuum condition, to effect vacuum drying of the printed boards P. The degree of vacuum to be attained may be sufficient if it is such as to be lower than the saturation vapor pressure of water, namely 40 torr or below.

The printed boards P are preparatively heated by heaters 2a, 2b and hot air and, in addition, most of water is removed away already through such pre-heating step, so that when the inside of the vacuum container 1 is brought to a vacuum condition, instantaneously upon this the water on the printed boards P can evaporate and a complete drying can take place.

Now, a description will be entered into a continuous operation type vacuum drying apparatus.

Figure 2:
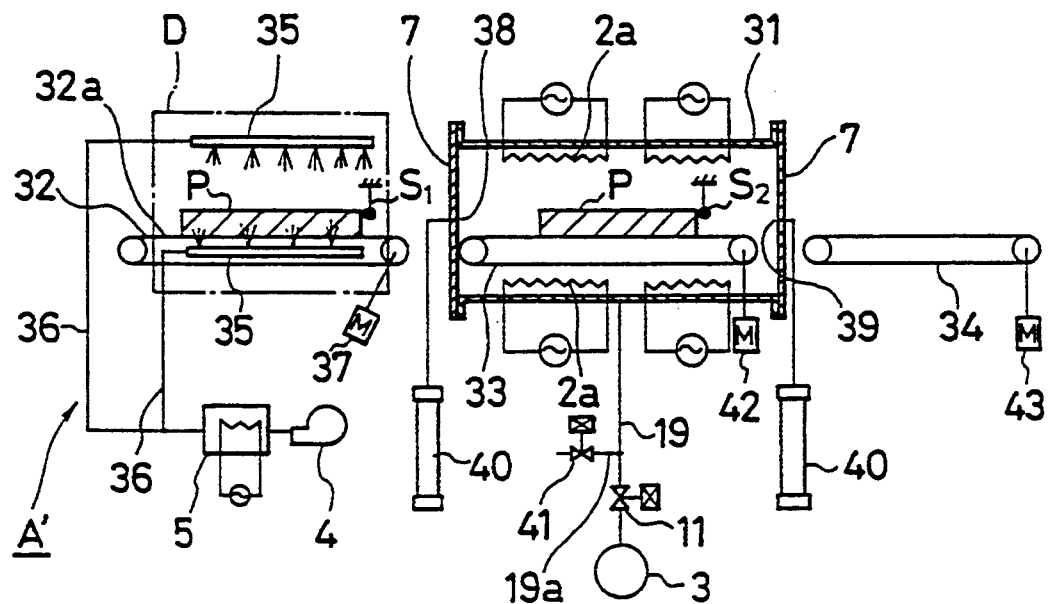
FIG. 2 is a schematic view of vacuum drying apparatus for the continuous type operation, according to the present invention.

In FIG. 2, the reference character A' represents a continuous operation type vacuum drying apparatus, which includes three mesh conveyers 32, 33 and 34 which are arranged in series.

The conveyer 32 is in a pre-heating zone D, in which hot air blow-out ducts 35 are disposed above and below a transfer surface 32a of the conveyer 32. Pipes 36 communicating with the hot air blow-out ducts 35 are provided with a gas heating device 5 and a blower 4. Further provided in the pre-heating zone D is a product detecting sensor $S_1$, and an arrangement is made such that when the sensor $S_1$ detects a printed board P, namely a product, an electric motor 37 for driving the conveyer 32 stops rotating.

The conveyer 33 is housed in a box-shaped vacuum container 31, in which heaters 2a, 2b are provided. Further, the vacuum container 31 is formed with an inlet opening 38 and an outlet opening 39, each of which can be sealably closed by a door 7. Doors 7 can be opened or closed by air cylinders 40. A pipe 19 communicating with the vacuum container 31 is provided with a valve 11 and a vacuum pump 3. Also, the pipe 19 has a branch pipe 19a, which is provided with a valve 41. Further, a sensor $S_2$ for detecting products is mounted above the conveyer 33, and an arrangement is made such that when the sensor $S_2$ detects a printed board, a product, an electric motor 42 for driving the conveyer 33 stops rotating.

The conveyer 34 located downstream of the vacuum container 31 is so arranged as to be constantly driven by an electric motor 43.

Now, a description will be given the operation of the vacuum drying apparatus having the above described structure according to the present invention.

As soon as a printed board P washed with water is detected by the sensor $S_1$ in the pre-heating zone D, the conveyer 32 is brought to a halt, and the printed board P on the conveyer 32 is preparatively heated by hot air blown out through the hot air blow-out ducts 35, and at the same time as this, most of water attached on the printed board P is removed away.

After the lapse of the prescribed length of time, the doors 7 and 7 of the vacuum container 1 are opened and, at the same time, the electric motors 37 and 42 start rotating to cause the printed board P to be transferred from the conveyer 32 in the pre-heating zone onto the conveyer 33 in the vacuum container 31. When the sensor $S_2$ within the vacuum container 31 then detects the printed board P, the rotation of electric motor 42 is stopped.

As soon as the electric motor 42 is stopped, the inlet opening 38 and the outlet opening 39 of the vacuum container 31 are closed with doors 7 and 7, and heaters 2a, 2b and the vacuum pump 3 start operating. The printed board P is preparatively heated with hot air and most of the water is already removed away during the pre-heating as described above, so that when the inside of the vacuum container 31 is brought to a vacuum condition, the water possibly remaining present on the printed board P can instantaneously evaporate and a complete drying can take place. At this operation stage, a next printed board P conveyed into the pre-heating zone D of the conveyer 32 is in process of undergoing pre-heating.

After the lapse of the prescribed length of time, a valve 11 is closed and, at the same time, a valve 41 of a branch pipe 19a is opened to return the inside of the vacuum container 31 to atmospheric. Thereafter, the doors 7 and 7 of the vacuum container 31 are opened and, at the same time, electric motors 37 and 41 are rotated, whereby the printed board P within the vacuum container 31 becomes transferred onto the conveyer 34 downstream of the container 31, and at the same time as this, the printed board P on the conveyer 32 upstream of the container 31 is transferred into the vacuum container 31 and a next vacuum drying operation is entered.

Depending on particular products, there may possibly be instances in which water permeated in fine gaps in the product can hardly be removed. Even in such cases, products are continuously supplied by the conveyer 32, so that it is necessary to effect the vacuum drying without lowering a conventionally .attained production rate. This requirement can be answered by making it possible to switch a plurality of parallel arranged vacuum containers from one to another in operation.

Figure 3:
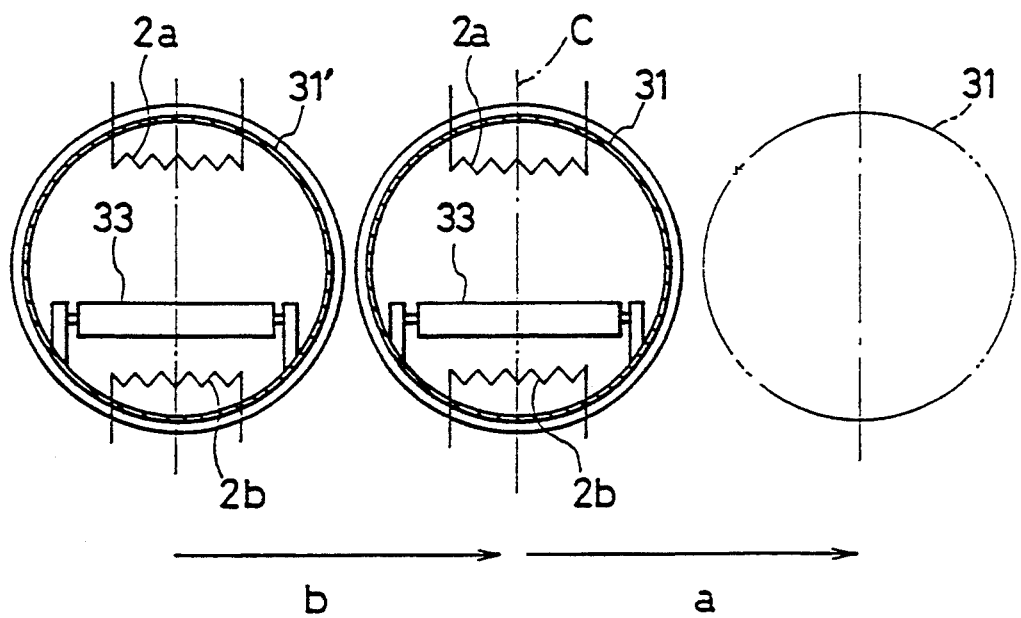
FIG. 3 is a schematic view of another embodiment of the vacuum drying apparatus for the continuous type operation, according to the present invention.

That is to say, as shown in FIG. 3, it may be devised that at the left side of a main vacuum container 31 located on the center line position C of a production line comprising conveyers 32, 33, 34 and so forth, there is parallel arranged a vacuum sub-container 31' having a same structure as the main vacuum container 31.

Then, with a printed board P disposed within the main vacuum container 31, this container 31 is laterally moved as shown by an arrow a to a waiting position as shown by a two-dots-dash circle line, and at the same time as this, the vacuum sub-container 31' is also laterally moved as shown by an arrow b to bring its center line position to be aligned with the center line position C of the production line. Thus, while a printed board P is supplied into the vacuum sub-container 31', the printed board P inside the main vacuum container 31 is subjected to vacuum drying.

After the prescribed length of time has lapsed, the sub-container 31' is moved in the direction opposite the direction shown by the arrow b to return it to the initial position and, at the same time, the main vacuum container 31 is returned to the central line position C of the production line. Then, while, with the doors 7 and 7 of the main vacuum container 31 are opened, the dried printed board P is transferred onto the downstream-side conveyer 34, the printed board P inside the vacuum sub-container 31' is subjected to vacuum drying.

According to the above way of processing, the time required for the supplying and the discharging of a printed board P into and out of one of the two vacuum containers can be utilized for the time for the vacuum drying in the other vacuum container, whereby vacuum drying of products can be carried out without lowering the conventionally attained production rates.

What is claimed is:

1. A vacuum drying apparatus characterized by a means for pre-heating a product by hot air, incorporated in a vacuum container having a heater housed therein and in that the vacuum container having a heater housed therein contains one of plural serially arranged conveyers and that said means includes a hot air blow-out device provided to a conveyer located upstream of said one of said plural serially arranged conveyors provided with the vacuum container.

2. A vacuum drying apparatus according to claim 1, further characterized in that a plurality of vacuum containers is provided in a parallel arrangement and in a manner such that the vacuum containers can be switched from one to another.

* * * * *